(12) United States Patent
Milstead et al.

(10) Patent No.: US 11,023,626 B2
(45) Date of Patent: Jun. 1, 2021

(54) SYNCHRONIZED ARCHITECTURE DESIGN AND ANALYSIS

(71) Applicant: The Boeing Company, Chicago, IL (US)

(72) Inventors: James Michael Milstead, Madison, AL (US); Theron Edward Ruff, Huntsville, AL (US); Roger Keith Bolton, Madison, AL (US); Robert Arthur Hartung, Lacey's Spring, AL (US); Harold Albert Robbins, Colorado Springs, CO (US)

(73) Assignee: The Boeing Company, Chicago, IL (US)

( * ) Notice: Subject to any disclaimer, the term of this patent is extended or adjusted under 35 U.S.C. 154(b) by 804 days.

(21) Appl. No.: 15/621,916

(22) Filed: Jun. 13, 2017

(65) Prior Publication Data

US 2018/0357358 A1    Dec. 13, 2018

(51) Int. Cl.
*G06F 30/15* (2020.01)
*G06F 30/00* (2020.01)
*G06F 30/18* (2020.01)
*G06F 30/20* (2020.01)

(52) U.S. Cl.
CPC .............. *G06F 30/15* (2020.01); *G06F 30/00* (2020.01); *G06F 30/18* (2020.01); *G06F 30/20* (2020.01)

(58) Field of Classification Search
CPC .......... G06F 30/15; G06F 30/18; G06F 30/00; G06F 30/20

USPC ............................................................ 703/6
See application file for complete search history.

(56) References Cited

U.S. PATENT DOCUMENTS

| | | | |
|---|---|---|---|
| 7,788,070 B2 | 8/2010 | Grichnik et al. | |
| 8,744,821 B2* | 6/2014 | Oh | G06F 30/20 703/6 |
| 2007/0219764 A1 | 9/2007 | Backe et al. | |
| 2012/0316821 A1* | 12/2012 | Levermore | G06Q 10/06 702/127 |

* cited by examiner

*Primary Examiner* — Kamini S Shah
*Assistant Examiner* — Faraj Ayoub
(74) *Attorney, Agent, or Firm* — Haynes and Boone, LLP (57) ABSTRACT

A computer-implemented method and apparatus for automating design, analysis, and product management synchronization in a model-based systems engineering environment. An analysis template is linked to a system architecture representing a product to be manufactured. A set of properties for an architectural element of the system architecture is extracted based on an analysis instance created from the analysis template. The set of properties is converted into a variable input-output structure. An analysis is run using the variable input-output structure to generate results. The results are linked to the analysis instance such that the analysis instance provides a time-based record of the analysis; to the system architecture to update a set of architectural elements impacted by the results; and to a product management tool, thereby synchronizing the design, the analysis, and the product management of the product to improve an efficiency in the design and manufacturing of the product.

25 Claims, 9 Drawing Sheets

SYNCHRONIZED ARCHITECTURE DESIGN AND ANALYSIS

BACKGROUND INFORMATION

1. Field

The present disclosure relates generally to model-based systems engineering. More particularly, the present disclosure relates to a method and system for synchronizing the design, analysis, and product management of a complex system.

2. Background

Model-based systems engineering (MBSE) involves the application of computer-based modeling to support activities related to the system requirements, design, analysis, verification, and validation of a system over the life cycle of the system. A variety of tools may be used to support the generation of models for the system and links between these models.

For example, an engineering tool may be used to manage the design of a using a system architecture that represents the system. An analysis tool may be used to perform analysis based on the system architecture. A product management tool may be used to control the configuration of the results of the analysis. Many different versions of each of these types of tools may be created for different use cases. Further, any combination of tool versions may be selected for managing the life cycle of a system.

Providing integration and synchronization between these different tools may be complex and more difficult than desired. Currently, manual processes may be used to update system architecture models based on analysis results and to maintain analysis models as the system architecture models and design models evolve. This type of manual processing may be inefficient and more prone to errors than desired. Therefore, it would be desirable to have a method and apparatus that take into account at least some of the issues discussed above, as well as other possible issues.

SUMMARY

In one illustrative embodiment, a computer-implemented method is provided for automating synchronization of design, analysis, and product management in a model-based systems engineering environment. The computer-implemented method includes linking an analysis template to a system architecture that represents a product to be manufactured. A set of properties for an architectural element of the system architecture is extracted based on an analysis instance created from the analysis template. The set of properties is converted into a variable input-output structure. An analysis of the architectural element is run using the variable input-output structure to generate results. The results are linked to the analysis instance such that the analysis instance provides a time-based record of the analysis; to the system architecture to update a set of architectural elements impacted by the results; and to a product management tool, thereby synchronizing the design, the analysis, and the product management of the product to improve an efficiency in the design and manufacturing of the product.

In another illustrative embodiment, a computer-implemented method is provided for automating synchronization of design, analysis, and product management in a model-based systems engineering environment. The computer-implemented method includes linking an analysis template to a system architecture that represents a product to be manufactured. A set of properties for a set of source architectural elements in a system architecture is extracted based on an analysis instance created from the analysis template. The set of properties is converted into a variable input-output structure. An analysis is run using the variable input-output structure to generate results. The results of the analysis are configured into configured results that are in a format compatible with a product management tool. The configured results are linked to the analysis instance such that the analysis instance provides a time-based record of the analysis; to the system architecture to update a set of architectural elements impacted by the results; and to the product management tool, thereby synchronizing the design, the analysis, and the product management of the product to improve an efficiency in the design and manufacturing of the product.

In yet another illustrative embodiment, a system comprises an engineering tool, an architecture translator, an analysis tool, and an analysis translator all implemented in a computer system. The engineering tool links an analysis template to a system architecture representing a product to be manufactured and extracts a set of properties for an architectural element of the system architecture based on an analysis instance created from the analysis template. The architecture translator converts the set of properties into a variable input-output structure. The analysis tool runs an analysis using the variable input-output structure to generate results. The analysis translator converts the results of the analysis into configured results that are in a format compatible with a product management tool. The configured results are linked to the analysis instance such that the analysis instance provides a time-based record of the analysis; linked to the system architecture to update a set of architectural elements impacted by the results; and linked to the product management tool, thereby synchronizing the design, the analysis, and the product management of the product to improve an efficiency in the design and manufacturing of the product.

The features and functions can be achieved independently in various embodiments of the present disclosure or may be combined in yet other embodiments in which further details can be seen with reference to the following description and drawings.

BRIEF DESCRIPTION OF THE DRAWINGS

The novel features believed characteristic of the illustrative embodiments are set forth in the appended claims. The illustrative embodiments, however, as well as a preferred mode of use, further objectives and features thereof, will best be understood by reference to the following detailed description of an illustrative embodiment of the present disclosure when read in conjunction with the accompanying drawings, wherein:

DETAILED DESCRIPTION

The illustrative embodiments recognize and take into account different considerations. For example, the illustrative embodiments recognize and take into account that it may be desirable to have a method and apparatus for automating the synchronization of design, analysis, and product management in a model-based systems engineering environment. In particular, this synchronization may be achieved by providing linking an engineering tool, an analysis tool, and a product management tool in a manner that provides a complete traceable record of the design, analysis, and analysis results generated for a system product over the evolution of the design for that system product.

Thus, the illustrative embodiments provide a method for efficiently and accurately automating the synchronization of an engineering tool, an analysis tool, and a product management tool in a model-based systems engineering environment. In another illustrative embodiment, a computer-implemented method is provided for automating synchronization of design, analysis, and product management in a model-based systems engineering environment. The computer-implemented method includes linking an analysis template to a system architecture that represents a product to be manufactured. A set of properties for a set of source architectural elements in a system architecture is extracted based on an analysis instance created from the analysis template. The set of properties is converted into a variable input-output structure. An analysis is run using the variable input-output structure to generate results. The results of the analysis are configured into configured results that are in a format compatible with a product management tool. The configured results are linked to the analysis instance such that the analysis instance provides a time-based record of the analysis; to the system architecture to update a set of architectural elements impacted by the results; and to the product management tool, thereby synchronizing the design, the analysis, and the product management of the product to improve an efficiency in the design and manufacturing of the product.

Automating the synchronization of these tools in the manner described above may reduce the number of updates that are need to the individual tools over time. Further, this type of automated synchronization may reduce or eliminate the need for exposing end-users, such as system architects and analysts, to the particulars of the analysis process. Still further, this type of automated synchronization allows the version of each tool that is best suited for a particular use case to be used irrespective of whether or not any cooperation or integration already exists between the tools or their vendors.

Figure 1:
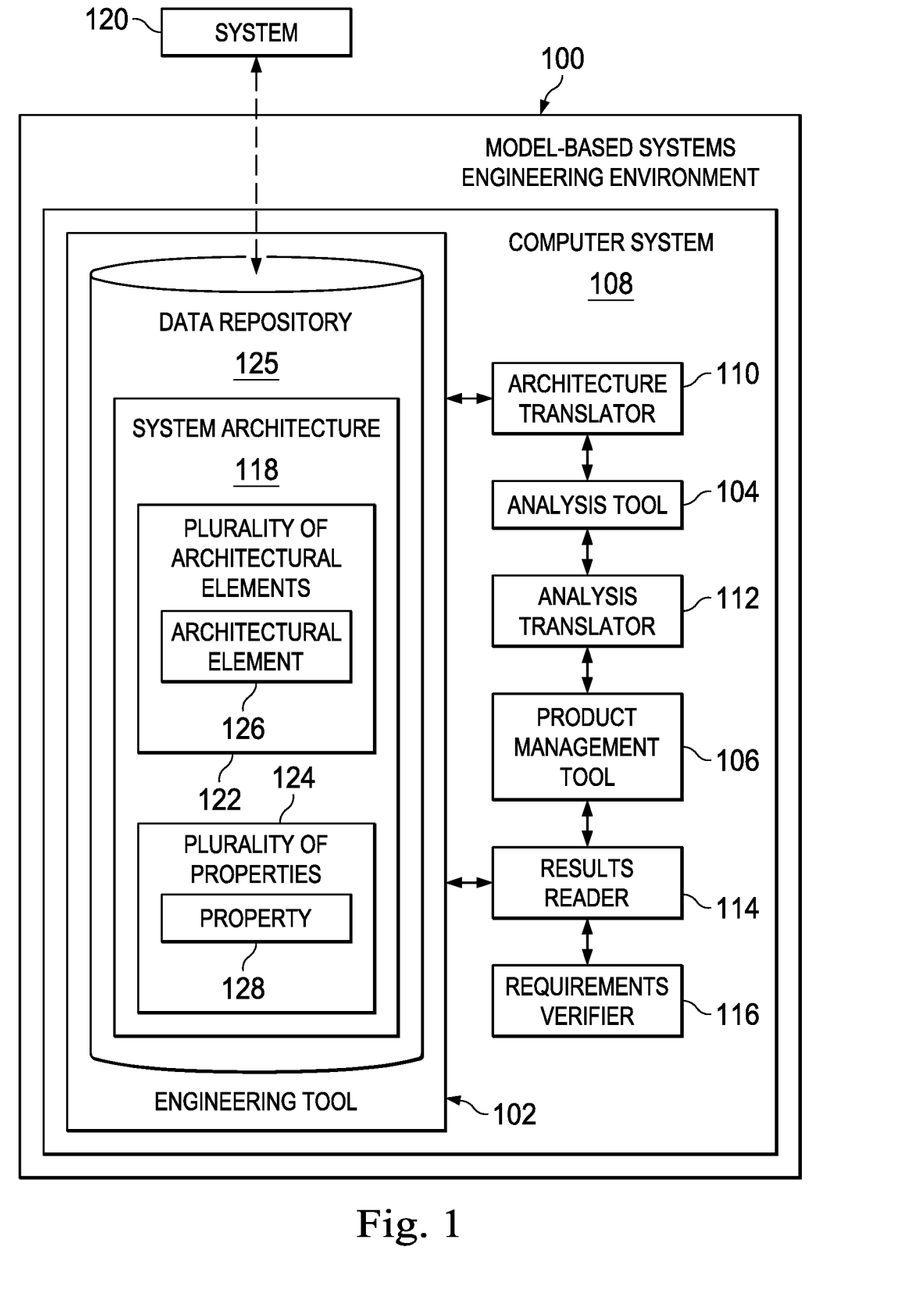
FIG. 1 is a block diagram of a model-based systems engineering environment in accordance with an illustrative embodiment.

Referring now to the figures and, in particular, with reference to FIG. 1, a block diagram of a model-based systems engineering environment is depicted in accordance with an illustrative embodiment. In this illustrative example, model-based systems engineering environment 100 includes engineering tool 102, analysis tool 104, and product management tool 106.

Each of engineering tool 102, analysis tool 104, and product management tool 106 may be implemented using software, hardware, firmware, or a combination thereof. In one illustrative example, these different tools may be implemented in software, hardware, firmware, or a combination thereof. When software is used, the operations performed by these tools may be implemented using, for example, without limitation, program code configured to run on a processor unit. When firmware is used, the operations performed by these tools may be implemented using, for example, without limitation, program code and data and stored in persistent memory to run on a processor unit.

When hardware is employed, the hardware may include one or more circuits that operate to perform the operations performed by these tools. Depending on the implementation, the hardware may take the form of a circuit system, an integrated circuit, an application specific integrated circuit (ASIC), a programmable logic device, or some other suitable type of hardware device configured to perform any number of operations.

In one illustrative example, engineering tool 102, analysis tool 104, and product management tool 106 are implemented using computer system 108. Computer system 108 may include one computer or multiple computers that are in communication with each other. This communication may include wired communication, wireless communication, or both.

As depicted, model-based systems engineering environment 100 also includes architecture translator 110, analysis translator 112, results reader 114, and requirements verifier 116. In one illustrative example, each of architecture translator 110, analysis translator 112, results reader 114, and requirements verifier 116 may be implemented in computer system 108. In other illustrative examples, architecture translator 110, analysis translator 112, results reader 114, and requirements verifier 116 may be implemented in another computer system (not shown). In still other illustrative examples, architecture translator 110, analysis translator 112, results reader 114, and requirements verifier 116 may be implemented using computer system 108 and one or more other computer systems.

Engineering tool 102 is used to create and manage system architecture 118. System architecture 118 may be comprised of one or more models that define the structure and function of product 120, as well as the organization of components that make up product 120 and the relationships of these components to each other within product 120. Product 120 may be a system, an assembly, a sub-assembly, a part, or some other type of product. For example, product 120 may be, but is not limited to, an aircraft, a ship, a spacecraft, a watercraft, an engine system, a mechanical device, a composite structure, a vehicle frame, a computer network, or some other type of system.

System architecture 118 is comprised of plurality of architectural elements 122. Each architectural element in plurality of architectural elements 122 represents a component that makes up product 120. This component may be a physical component, a conceptual component, a functional component, or some other type of component.

Further, system architecture 118 is associated with plurality of properties 124. Each property in plurality of properties 124 may be associated with one or more architectural elements of plurality of architectural elements 122. For example, plurality of architectural elements 122 includes architectural element 126 and plurality of properties 124 includes property 128 associated with architectural element 126. Further, architectural element 126 may be associated with one or more properties in addition to property 128.

System architecture 118 may be stored in data repository 125. Data repository 125 may take a number of different forms. For example, data repository 125 may take the form of a database, a data storage unit, memory, associative memory, some other type of data structure, or a combination thereof.

Analysis tool 104 provides one or more methods for analyzing system architecture 118. These analysis methods may include, but are not limited to, any number of spreadsheets, simulations, analysis models, formulas, computer application code, or combination thereof.

Product management tool 106 controls the configuration of the results of the analysis performed by analysis tool 104. For example, product management tool 106 may configure the results of the analysis for the general of formal analysis reports.

In these illustrative examples, analysis translator 112 provides integration between engineering tool 102 and analysis tool 104. Analysis translator 112 provides integration between analysis tool 104 and product management tool 106. Results reader 114 and requirements verifier 116 help provide integration between product management tool 106 and engineering tool 102. In other words, engineering tool 102, analysis tool 104, and product management tool 106 may be synchronized through architecture translator 110, analysis translator 112, results reader 114, and requirements verifier 116. This synchronization may be automated and may be performed without requiring modifications to the individual tools.

Figure 2:
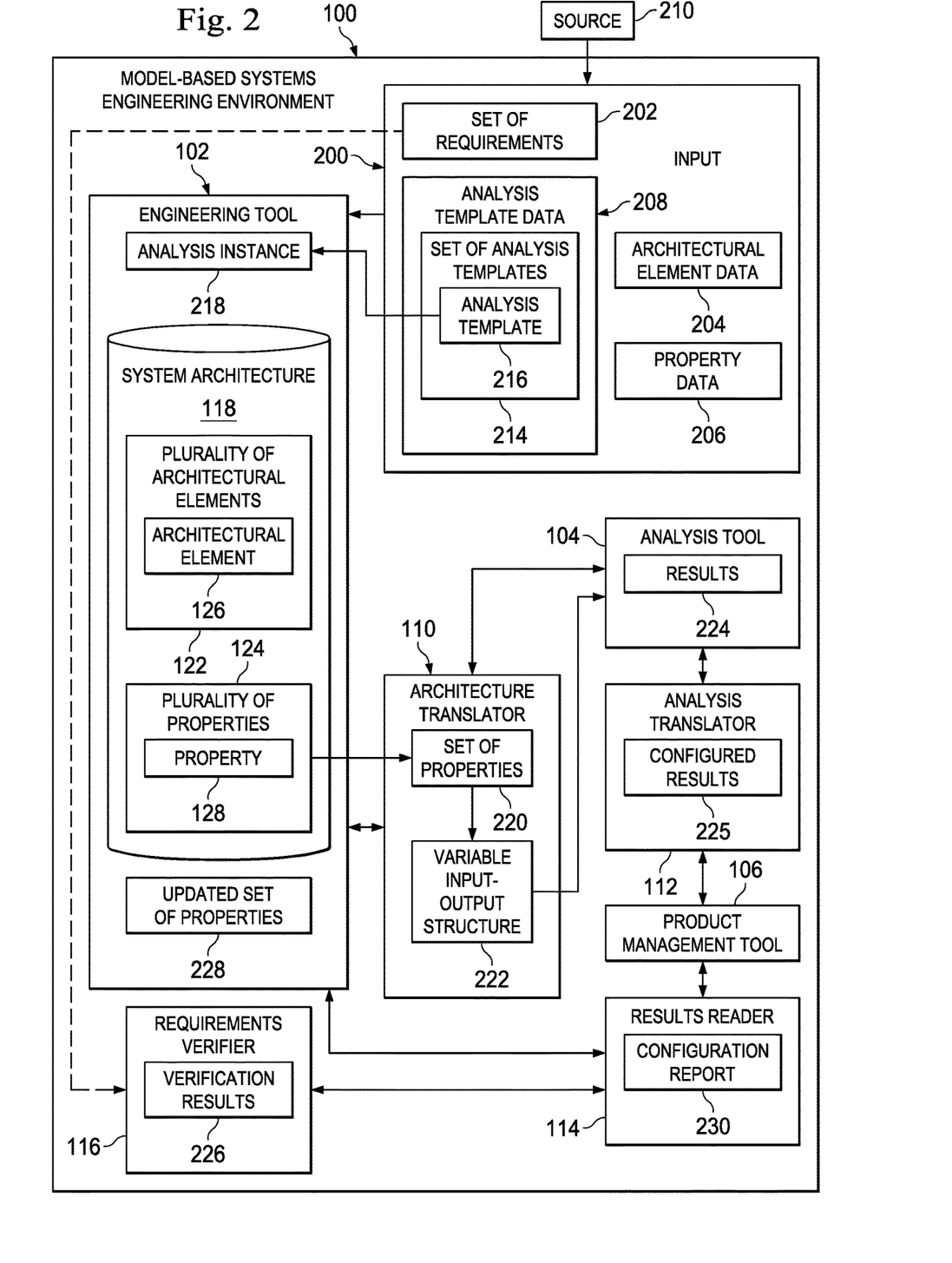
FIG. 2 is a block diagram detailing the synchronization between an engineering tool, an analysis tool, and a product management tool from in accordance with an illustrative embodiment.

With reference now to FIG. 2, a block diagram detailing the synchronization between engineering tool 102, analysis tool 104, and product management tool 106 from FIG. 1 is depicted in accordance with an illustrative embodiment. In this illustrative example, engineering tool 102, analysis tool 104, and product management tool 106 are synchronized such that results from the activity of one tool are reflected in the activities of the other tools.

For example, these tools are used to create and update system architecture 118 for product 120 to manage the system requirements, design, analysis, verification, and validation of product 120 in FIG. 1 over the life cycle of product 120. In one illustrative example, engineering tool 102 builds system architecture 118 based on input 200. Input 200 may include various types of information for building system architecture 118. For example, input 200 may include set of requirements 202, architectural element data 204, property data 206, analysis template data 208, other types of information, or a combination thereof.

Engineering tool 102 may receive input 200 from source 210. Source 210 may take a number of different forms. As one illustrative example, source 210 may be an input device that is operated by a human user. In other illustrative examples, source 210 may be a computer, an input device operated by a computer, a different tool implemented within computer system 108 in FIG. 1, some other type of input source, or a combination thereof.

Set of requirements 202 may include design requirements, manufacturing requirements, performance requirements, safety requirements, functional requirements, some other type of requirements, or a combination thereof for product 120. Architectural element data 204 may include data for plurality of architectural elements 122 that will make up system architecture 118. Property data 206 may include data for plurality of properties 124 that are to be associated with plurality of architectural elements 122. For example, property data 206 may define at least one property for a particular architectural element and a value for that property.

Analysis template data 208 may define set of analysis templates 214 that are to be used for performing analysis of plurality of architectural elements 122. Set of analysis templates 214 may include any number of analysis templates. In some illustrative examples, multiple analysis templates in set of analysis templates 214 may be combined or integrated to form an "analysis super-template."

In one illustrative example, set of analysis templates 214 includes analysis template 216. Analysis template 216 describes the analysis to be performed for one or more architectural elements and describes any links between architectural elements that may be dependent with respect to the analysis to be performed.

Analysis template may be configured in a manner that allows an analyst, engineer, or other operator to be able to understand the analysis via conventional model-based diagramming notation. For example, analysis template 216 may be in the Systems Modeling Language (SysML), which is a general purpose modeling language for engineering systems. In some cases, analysis template 216 has a particular configuration that may evolve over time.

In one illustrative example, engineering tool 102 is configured to link analysis template 216 to system architecture 118. Linking analysis template 216 to system architecture 118 may include storing analysis template 216 in association with system architecture 118. In some cases, analysis template 216 may be made part of system architecture 118. Further, linking analysis template 216 may also include linking set of source architectural elements 215 and set of destination architectural elements 217 defined in analysis template 216 to system architecture 118.

Set of source architectural elements 215 may be one or more architectural elements of plurality of architectural elements 122 that are to be used in the analysis described by analysis template 216. Set of destination architectural elements 217 may be one or more architectural elements of plurality of architectural elements 122 that would be impacted by the results of this analysis.

In some cases, analysis template 216 may also describe how set of destination architectural elements 217 would be affected. For example, analysis template 216 may indicate that if the analysis generates a result with a value greater than some threshold, then a value of a property of a particular destination architectural element is to be increased or decreased by a selected amount.

When an analysis is to be run, engineering tool 102 may receive input that creates an analysis instance. For example, this input may cause analysis template 216 to be instantiated as analysis instance 218. Analysis instance 218 represents one occurrence of analysis template 216 and records the particular configuration of analysis template 216 at the time of this occurrence.

In response to the creation of analysis instance 218 from analysis template 216, engineering tool 102 extracts set of properties 220 for at least one architectural element of system architecture 118 based on analysis instance 218. For example, without limitation, engineering tool 102 may extract set of properties 220 for architectural element 126. Engineering tool 102 then sends set of properties 220 to architecture translator 110 for processing.

Architecture translator 110 converts set of properties 220 into variable input-output structure 222. Variable input-output structure 222 may have a hierarchical structure similar to system architecture 118. In particular, variable input-output structure 222 may be a type of hierarchical organization of inputs and outputs based on analysis instance 218 that allows for linking set of properties 220 to the inputs and outputs of the analysis that is to be performed. For example, variable input-output structure 222 may include a set of inputs, a set of outputs, and a set of relationships between the set of inputs and the set of outputs organized based on both analysis instance 218 and the hierarchical structure of system architecture 118.

In this manner, architecture translator 110 translates the architectural hierarchy associated with set of properties 220 and system architecture 118 into a variable input/output format. This type of abstraction ensures that this methodology may be used with any given engineering tool 102 and any given analysis tool 104, regardless of their respective configurations.

Architecture translator 110 sends variable input-output structure 222 to analysis tool 104 for processing. Analysis tool 104 runs the analysis of architectural element 126 using the variable input-output structure 222. In some illustrative examples, analysis tool 104 may receive additional input from source 210 or some other type of source that specifies additional factors to be taken into account during analysis. This additional input may identify optimization goals for certain properties, experimental design constraints, other types of information, or a combination thereof.

Analysis tool 104 runs the analysis of architectural element 126 using variable input-output structure 222 to generate results 224. Analysis tool 104 sends results 224 to analysis translator 112 for processing. Results 224 may be in a native or raw format. Analysis translator 112 converts results 224 into a format that can be processed and managed by product management tool 106. In particular, analysis translator 112 converts results 224 into configured results 225. Configured results 225 may be in a format that is compatible with product management tool 106. In this manner, different formats and versions of analysis tool 104 may be used with different formats and versions of product management tool 106.

Analysis translator 112 then sends or uploads configured results 225 to product management tool 106. Product management tool 106 may send an alert to results reader 114 indicating that configured results 225 have been received. Depending on the implementation, this alert may include general information or condensed information about configured results 225.

In one illustrative example, results reader 114 reads configured results 225 to determine whether configured results 225 are in the proper format and that the analysis was performed correctly. If results reader 114 determines that configured results 225 are in the proper format and that the analysis was performed correctly, results reader 114 sends configured results 225 to requirements verifier 116 for verification of configured results 225.

Requirements verifier 116 may then perform an evaluation of configured results 225. For example, requirements verifier 116 may compare configured results 225 to set of requirements 202, or at least a portion of set of requirements 202 to generate verification results 226. In particular, verification results 226 may identify whether configured results 225 of the analysis indicate that architectural element 126 meets the portion of set of requirements 202 applicable to architectural element 126 or not.

Requirements verifier 116 may then send verification results 226 to results reader 114. If the verification results 226 indicate that configured results 225 have been verified, results reader 114 may then generate an alert or prompt requesting approval of configured results 225. As one illustrative example, this alert may be generated on a display device for display to a human operator such that human approval may be received. In another illustrative example, this alert may be generated and sent to another tool within model-based systems engineering environment 100 in FIG. 1 for approval.

Once approval of configured results 225 has been received, at least one of results reader 114, engineering tool 102, architecture translator 110, or analysis translator 112 links configured results 225 to analysis instance 218 such that analysis instance 218 provides a time-based record of the analysis. Further, configured results 225 may be linked to system architecture 118 to update set of destination architectural elements 217 impacted by configured results 225. Still further, configured results 225 are linked product management tool 106. These various linkages synchronize the design, the analysis, and the product management of product 124 to improve an efficiency in the design and manufacturing of product 124.

Configured results 225 may be linked to analysis instance 218 in various ways. In one illustrative example, configured results 225 are stored in analysis instance 218. For example, the input values used in the analysis, the output values generated by the analysis, or both are added to analysis instance 218. In other words, analysis instance 218 is updated with configured results 225. Additionally, a linkage may be generated that links analysis instance 218 to configured results 225, which are stored by product management tool 106.

Linking configured results 225 to system architecture 118 may include storing analysis instance 218 that has been updated in association with system architecture 118. Further, linking configured results 225 to system architecture 118 may include updating system architecture 118 by, for example, updating one or more properties of one or more architectural elements of plurality of architectural elements 126 based on configured results 225. For example, at least one property for set of destination architectural elements 217 may be modified based on configured results 225. In some cases, a direct linkage may be created between system architecture 118 and configured results 225. Depending on the implementation, a linkage may be added between configured results 225 and each of set of destination architectural elements 217 involved in the analysis.

In other illustrative examples, results reader 114 may simply send a link to configured results 225 to engineering tool 102. Engineering tool 102 may then update analysis instance 218 and system architecture 118 based on configured results 225. Further, in this example, engineering tool 102 may add a link between analysis instance 218 and configured results 225 and at least one link between system architecture 118 and configured results 225.

Linking configured results 225 to product management tool 106 is performed by the uploading of configured results 225 to product management tool 106. In some cases, this linking may include maintaining a link between the original results 224 and configured results 225, independently of product management tool 106.

Once analysis instance 218 and system architecture 118 have been updated, engineering tool 102 may extract updated set of properties 228 from system architecture 118. Updated set of properties 228 may include one or more properties for one or more architectural elements of system architecture 118. Engineering tool 102 sends updated set of properties 228 to architecture translator 110 for processing.

Architecture translator 110 may then generate configuration report 230 for system architecture 118 or a portion of system architecture 118 based on updated set of properties 228. Configuration report 230 may provide the details needed to control the detailed design and manufacturing of system architecture 118 or a portion of system architecture 118. In one illustrative example, configuration report 230 traces changes from a baseline configuration of system architecture 118 to a current configuration of system architecture 118.

In some illustrative examples, architecture translator 110 may be capable of translating configuration report 230 into a parametric computer-aided design (CAD) drawing that may be used to control the three-dimensional (3D) printing or manufacturing of a part. In other illustrative examples, architecture translator 110 may be capable of translating configuration report 230 into a set of instructions that may be sent to a computerized numerically controlled system for use in controlling the design and manufacturing of a part.

The above-described process may be repeated any number of times such that system architecture 118 evolves from a baseline on configuration to a current configuration. Accordingly, configuration report 230 may be able to trace the evolution of system architecture 118 from the baseline configuration to the current configuration based on linkages between system architecture 118 and the multiple analysis instances created and updated during the evolution of system architecture 118. Any number of analysis instances may be created for running analyses. Each analysis instance is a record of the particular input values used for the corresponding analysis. Further, analysis instances may be created for different analysis templates. In some cases, analysis tool 104 may run multiple analyses using the variable input-output structures generated for multiple analysis instances that were created from multiple analysis templates.

Thus, using the methodology and system described above, engineering tool 102, analysis tool 104, and product management tool 106 may be synchronized such that results from the activity of one tool are reflected in the activities of the other tools. The type of synchronization provided helps maintain consistency between the design of system architecture 118 and the supporting analysis. In some illustrative examples, this entire process may be fully automated. In other illustrative examples, a human operator may provide input and approvals where needed.

The creation of analysis instances and the updating of analysis instances, along with the updating of system architecture 118, allow the evolution of the analyses performed as system architecture 118 evolves to be recorded and tracked over time. In particular, this process allows each new configuration of system architecture 118 to be linked to the corresponding analyses run for that new configuration and to the configured results of those analyses.

The illustrations in FIG. 1 and in FIG. 2 are not meant to imply physical or architectural limitations to the manner in which an illustrative embodiment may be implemented. Other components in addition to or in place of the ones illustrated may be used. Some components may be optional. Also, the blocks are presented to illustrate some functional components. One or more of these blocks may be combined, divided, or combined and divided into different blocks when implemented in an illustrative embodiment.

Figure 3:
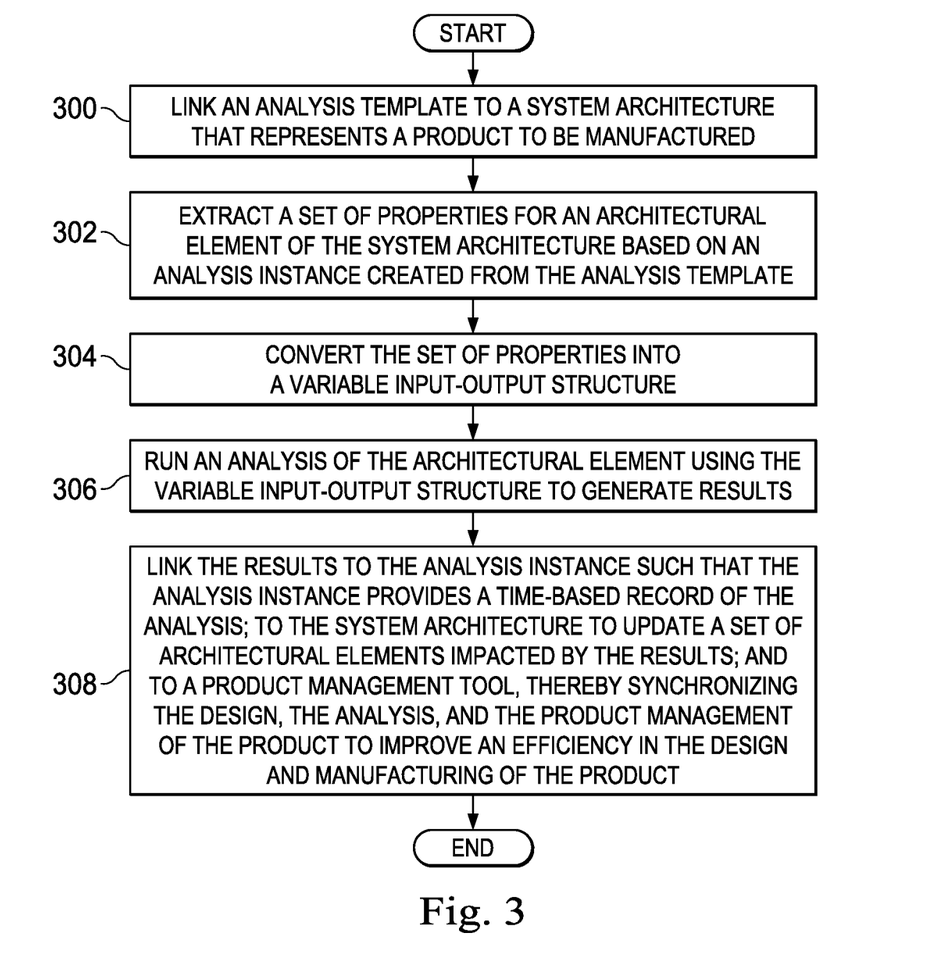
FIG. 3 is a flowchart of a process for providing automated synchronization of the design, analysis, and product management of a product to be manufactured in accordance with an illustrative embodiment.

With reference now to FIG. 3, a flowchart of a process for providing automated synchronization of the design, analysis, and product management of a product to be manufactured is depicted in accordance with an illustrative embodiment. The process illustrated in FIG. 3 may be implemented within model-based systems engineering environment 100 using the tools described in FIGS. 1-2.

The process begins by linking an analysis template to a system architecture that represents a product to be manufactured (operation 300). The analysis template may describe an analysis that is to be performed for the product. The analysis template may identify a set of source architectural elements and a set of destination architectural elements in the system architecture. The set of source architectural elements may be used for the analysis. The set of destination architectural elements may be impacted by the results of the analysis.

Next, a set of properties for an architectural element of a system architecture is extracted based on an analysis instance created from the analysis template (operation 302). In operation 302, the analysis instance is one instantiation of the analysis template. In other words, the analysis instance is one occurrence of the analysis template that records input values for the analysis to be run according to the analysis template.

Next, the set of properties is converted into a variable input-output structure (operation 304). This variable input-output structure may include a set of inputs, a set of outputs, and a set of relationships between the set of inputs and the set of outputs organized based on both the analysis instance and the hierarchical structure of the system architecture.

Thereafter, an analysis of the architectural element is run using the variable input-output structure to generate results (operation 306). The results are then linked to the analysis instance such that the analysis instance provides a time-based record of the analysis; to the system architecture to update a set of architectural elements impacted by the results; and to a product management tool, thereby synchronizing the design, the analysis, and the product management of the product to improve an efficiency in the design and manufacturing of the product (operation 308), with the process terminating thereafter.

Figure 4:
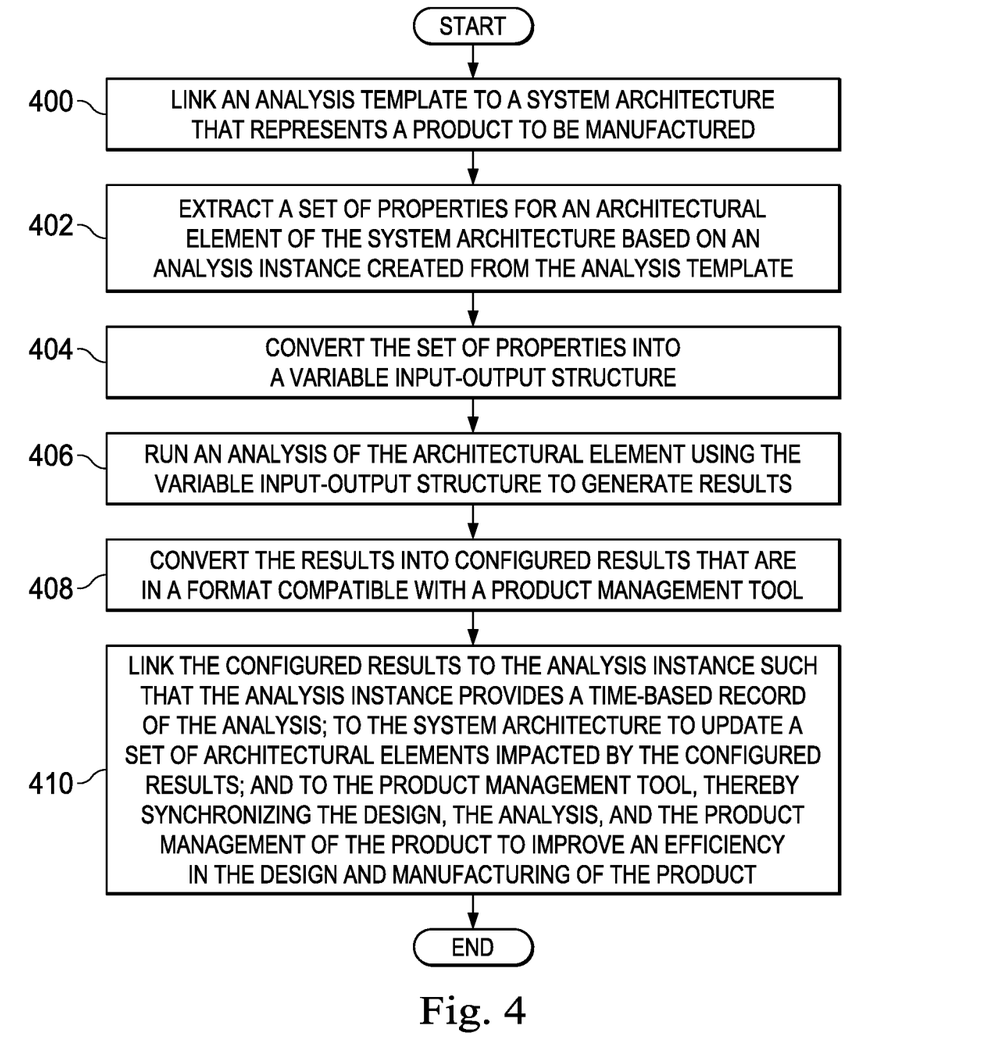
FIG. 4 is a flowchart of a process for providing automated synchronization of the design, analysis, and product management of a product to be manufactured in accordance with an illustrative embodiment.

With reference now to FIG. 4, a flowchart of a process for providing automated synchronization of the design, analysis, and product management of a product to be manufactured is depicted in accordance with an illustrative embodiment. The process illustrated in FIG. 4 may be implemented within model-based systems engineering environment 100 described in FIG. 1. In particular, this process may be implemented using engineering tool 102, analysis tool 104, product management tool 106, architecture translator 110, analysis translator 112, and results reader 114 described in FIGS. 1-2.

The process may begin by linking an analysis template to a system architecture that represents a product to be manufactured (operation 400). Next, a set of properties for a set of source architectural elements in a system architecture is extracted based on an analysis instance created from the analysis template (operation 402). Next, the set of properties is converted into a variable input-output structure (operation 404).

Thereafter, an analysis of the architectural element is run using the variable input-output structure to generate results (operation 406). The results of the analysis are converted into configured results that are in a format compatible with a product management tool (operation 408). The configured results are then linked to the analysis instance such that the analysis instance provides a time-based record of the analysis; to the system architecture to update a set of architectural elements impacted by the configured results; and to the product management tool, thereby synchronizing the design, the analysis, and the product management of the product to improve an efficiency in the design and manufacturing of the product (operation 410), with the process terminating thereafter.

Figure 5:
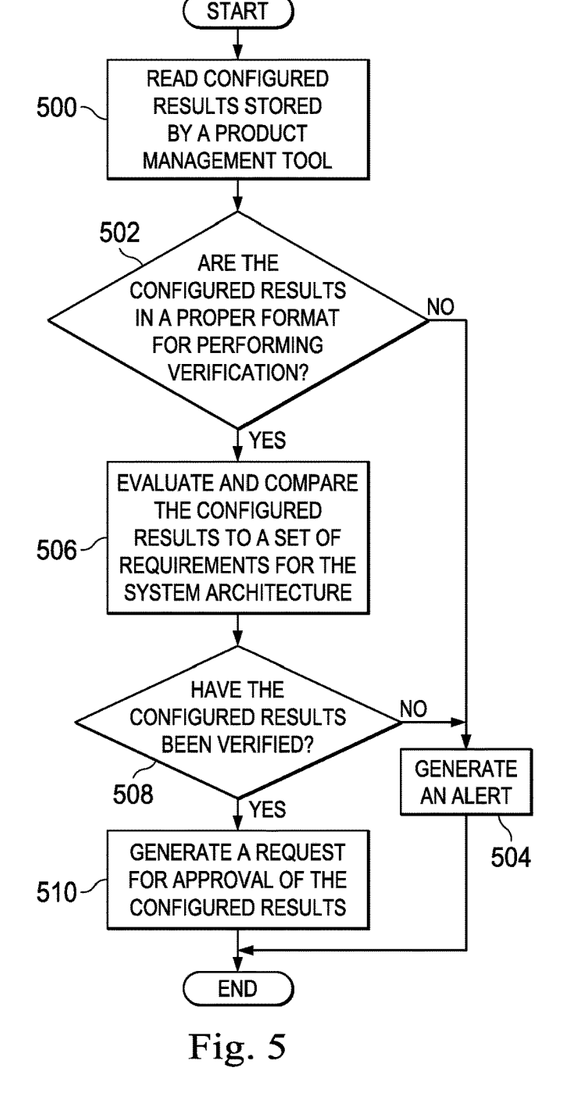
FIG. 5 is a flowchart of a process for performing a verification of analysis results in accordance with an illustrative embodiment.

With reference now to FIG. 5, a flowchart of a process for performing a verification of analysis results is depicted in accordance with an illustrative embodiment. The process illustrated in FIG. 5 may be implemented within model-based systems engineering environment 100 described in FIG. 1. In particular, this process may be implemented using product management tool 106, results reader 114, and requirements verifier 116, described in FIGS. 1-2.

The process may begin by reading configured results stored by a product management tool (operation 500). In operation 500, the configured results may be for the analysis of a system architecture. This analysis may be an analysis of one or more architectural elements of that system architecture or of the entire system architecture.

A determination may be made as to whether the configured results are in a proper format for performing verification (operation 502). If the configured results are not in a proper format for performing the verification, an alert is generated (operation 504), with the process terminating thereafter.

Otherwise, if the configured results are in the proper format, the configured results are evaluated and compared to a set of requirements for the system architecture (operation 506). A determination is made as to whether the configured results have been verified based on the verification results (operation 508).

If the configured results are not verified, the process proceeds to operation 504 described above. Otherwise, if the configured results are verified, a request for approval of the configured results is generated (operation 510), with the process terminating thereafter. In operation 510, the approval may be requested from another tool within model-based systems engineering environment 100 in FIG. 1 or from a human operator.

Figure 6:
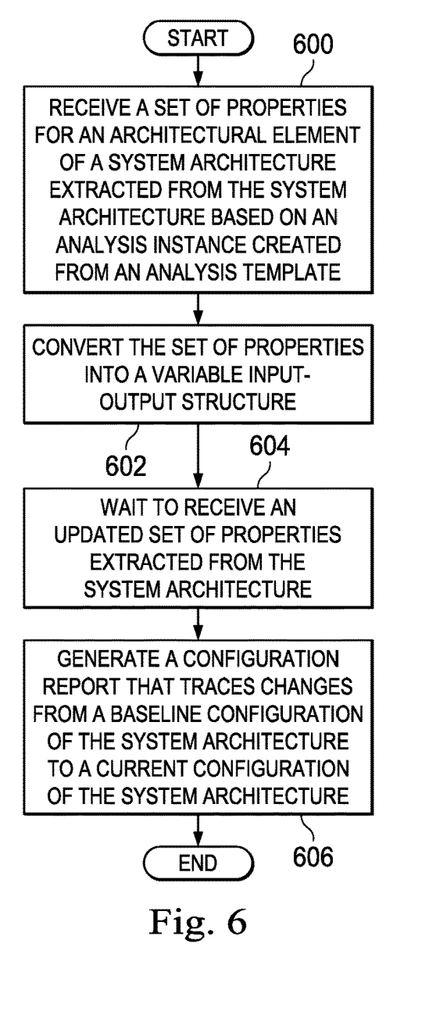
FIG. 6 is a flowchart of a process performed by an architecture translator in accordance with an illustrative embodiment.

With reference now to FIG. 6, a flowchart of a process performed by an architecture translator is depicted in accordance with an illustrative embodiment. The process illustrated in FIG. 6 may be implemented within model-based systems engineering environment 100 described in FIG. 1. In particular, this process may be implemented using architecture translator 110 described in FIGS. 1-2.

The process may begin by the architecture translator receiving a set of properties for an architectural element of a system architecture extracted from the system architecture based on an analysis instance created from an analysis template (operation 600). Next, the architecture translator converts the set of properties into a variable input-output structure (operation 602). In operation 602, the variable input-output structure may have a hierarchical organization similar to that of the system architecture. In some illustrative examples, the variable input-output structure includes a set of inputs, a set of outputs, and a set of relationships between the set of inputs and the set of outputs organized based on both the analysis instance and the hierarchical structure of the system architecture.

The architecture translator then waits to receive an updated set of properties extracted from the system architecture (operation 604). Depending on the implementation, the architecture translator may receive the updated set of properties after one analysis has been run for a single analysis instance. In other illustrative examples, the architecture translator may only receive the updated set of properties after multiple analysis instances for multiple analysis templates have been run.

In response to receiving the updated set of properties, the architecture translator generates a configuration report that traces changes from a baseline configuration of the system architecture to a current configuration of the system architecture (operation 606), with the process terminating thereafter. The configuration report may be used to control the detailed design and manufacturing of the system architecture or a portion of the system architecture such as a part of sub-part. In other illustrative examples, the architecture translator may further translate the configuration report generated in operation 606 into a parametric computer-aided design drawing for use in the three-dimensional printing or manufacturing of a part.

Figure 7:
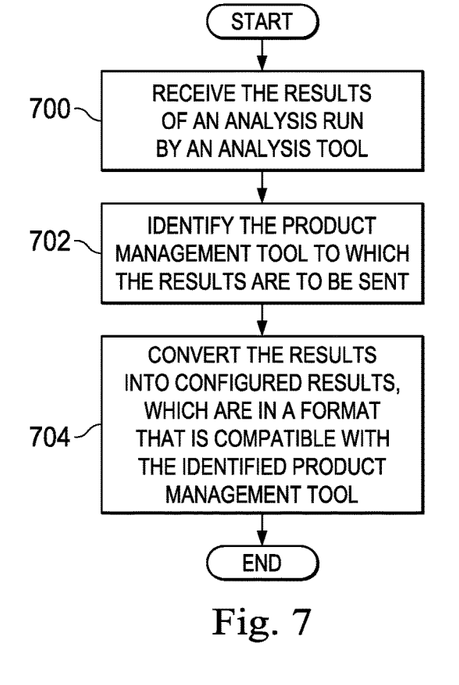
FIG. 7 is a flowchart of a process performed by an analysis translator in accordance with an illustrative embodiment.

With reference now to FIG. 7, a flowchart of a process performed by an analysis translator is depicted in accordance with an illustrative embodiment. The process illustrated in FIG. 7 may be implemented within model-based systems engineering environment 100 described in FIG. 1. In particular, this process may be implemented using analysis translator 112 described in FIGS. 1-2.

The process may begin by the analysis translator receiving the results of an analysis run by an analysis tool (operation 700). The analysis translator may then identify the product management tool to which the results are to be sent (operation 702).

Next, the analysis translator converts the results into configured results, which are in a format that is compatible with the identified product management tool (operation 704), with the process terminating thereafter. In this manner, the analysis translator may allow any format or version of the analysis tool to be used with any format or version of the product management tool. The best-qualified formats and versions of the analysis tool and product management tool for the specific purpose at hand may be used without having to alter the code or functionality of either the analysis tool or the product management tool more than desired.

Figure 8:
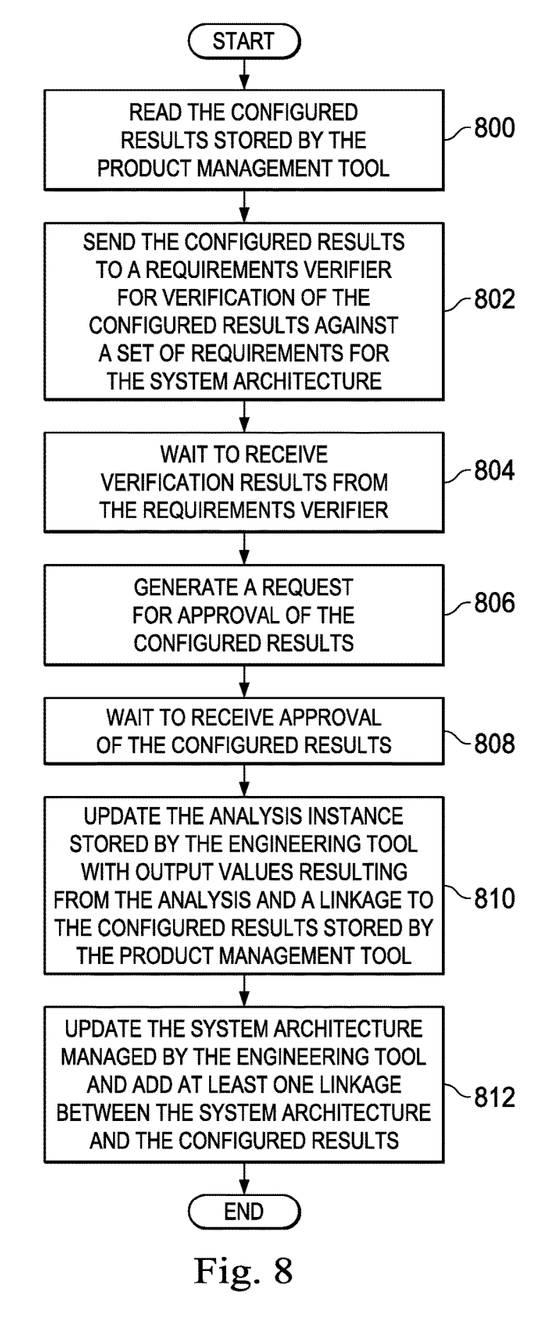
FIG. 8 is a flowchart of a process performed by a results reader in accordance with an illustrative embodiment.

With reference now to FIG. 8, a flowchart of a process performed by a results reader is depicted in accordance with an illustrative embodiment. The process illustrated in FIG. 8 may be implemented within model-based systems engineering environment 100 described in FIG. 1. In particular, this process may be implemented using results reader 114 described in FIGS. 1-2.

The process begins by the results reader reading the configured results stored by the product management tool (operation 800). Next, the results reader sends the configured results to a requirements verifier for verification of the configured results against a set of requirements for the system architecture (operation 802).

The results reader then waits to receive verification results from the requirements verifier (operation 804). In response to receiving the verification results, the results reader generates a request for approval of the configured results (operation 806). In one illustrative example, this request may be displayed on a display device to allow a human operator to enter input providing the approval. In another illustrative example, the request may be sent as an email that allows a human operator to enter input providing the approval. In yet another illustrative example, the request may be sent to a different tool in model-based systems engineering environment 100.

The results reader then waits to receive approval of the configured results (operation 808). In response to receiving the approval, the results reader updates the analysis instance stored by the engineering tool with output values resulting from the analysis and a linkage to the configured results stored by the product management tool (operation 810). Further, the results reader updates the system architecture managed by the engineering tool and adds at least one linkage between the system architecture and the configured results (operation 812), with the process terminating thereafter.

In other illustrative examples, in operation 810, the results reader sends an update file to the engineering tool that allows the engineering tool to update the analysis instance with the output values resulting from the analysis and a linkage to the configured results stored by the product management tool. Similarly, in these other examples, in operation 812, the results reader may send another update file to the engineering tool that allows the engineering tool to update the system architecture and add at least one linkage between the system architecture and the configured results.

Figure 9:
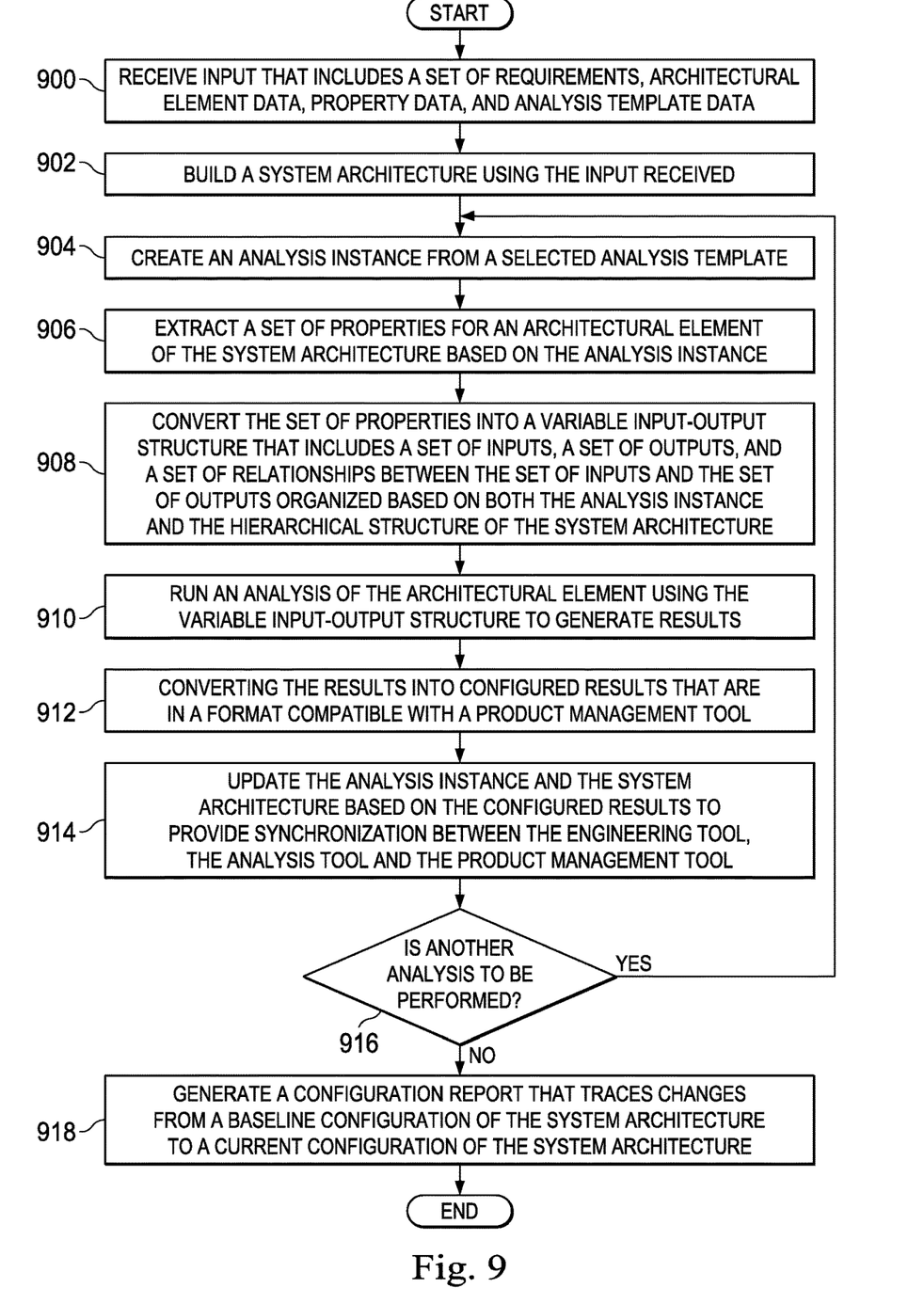
FIG. 9 is a flowchart of a process for providing synchronization between an engineering tool, an analysis tool, and a product management tool in accordance with an illustrative embodiment.

With reference now to FIG. 9, a flowchart of a process for providing synchronization between an engineering tool, an analysis tool, and a product management tool is depicted in accordance with an illustrative embodiment. The process illustrated in FIG. 9 may be implemented within model-based systems engineering environment 100 using the various tools described in FIGS. 1-2.

The process may begin by receiving input that includes a set of requirements, architectural element data, property data, and analysis template data (operation 900). In operation 900, the input may be implemented similar to input 200 in FIG. 2, which includes set of requirements 202, architectural element data 204, property data 206, and analysis template data 208 described in FIG. 2. The architectural element data received in operation 900 may include data for a plurality of architectural elements that will make up a system architecture. The analysis template data may include data for a plurality of analysis templates.

Next, a system architecture is built using the input received (operation 902). Thereafter, an analysis instance is created from a selected analysis template (operation 904). A set of properties for an architectural element of the system architecture is extracted based on the analysis instance (operation 906). The set of properties is converted into a variable input-output structure that includes a set of inputs, a set of outputs, and a set of relationships between the set of inputs and the set of outputs organized based on both the analysis instance and the hierarchical structure of the system architecture (operation 908).

Then an analysis of the architectural element is run using the variable input-output structure to generate results (operation 910). The results are converted into configured results that are in a format compatible with a product management tool (operation 912). The analysis instance and the system architecture are then updated based on the configured results to provide synchronization between the engineering tool, the analysis tool and the product management tool (operation 914). A determination is made as to whether another analysis is to be performed (operation 916). If another analysis is to be performed, the process proceeds to operation 904 as described above. When operation 904 is repeated, the selected analysis template from which the analysis instance is created may be the same or different from the previously selected analysis template. If no other analysis is to be performed, a configuration report that traces changes from a baseline configuration of the system architecture to a current configuration of the system architecture is generated (operation 918), with the process terminating thereafter.

The flowcharts and block diagrams in the different depicted embodiments illustrate the design, architecture, and functionality of some possible implementations of apparatuses and methods in an illustrative embodiment. In this regard, each block in the flowcharts or block diagrams may represent a module, a segment, a function, and/or a portion of an operation or step.

In some alternative implementations of an illustrative embodiment, the function or functions noted in the blocks may occur out of the order noted in the figures. For example, in some cases, two blocks shown in succession may be executed substantially concurrently, or the blocks may sometimes be performed in the reverse order, depending upon the functionality involved. Also, other blocks may be added in addition to the illustrated blocks in a flowchart or block diagram.

Figure 10:
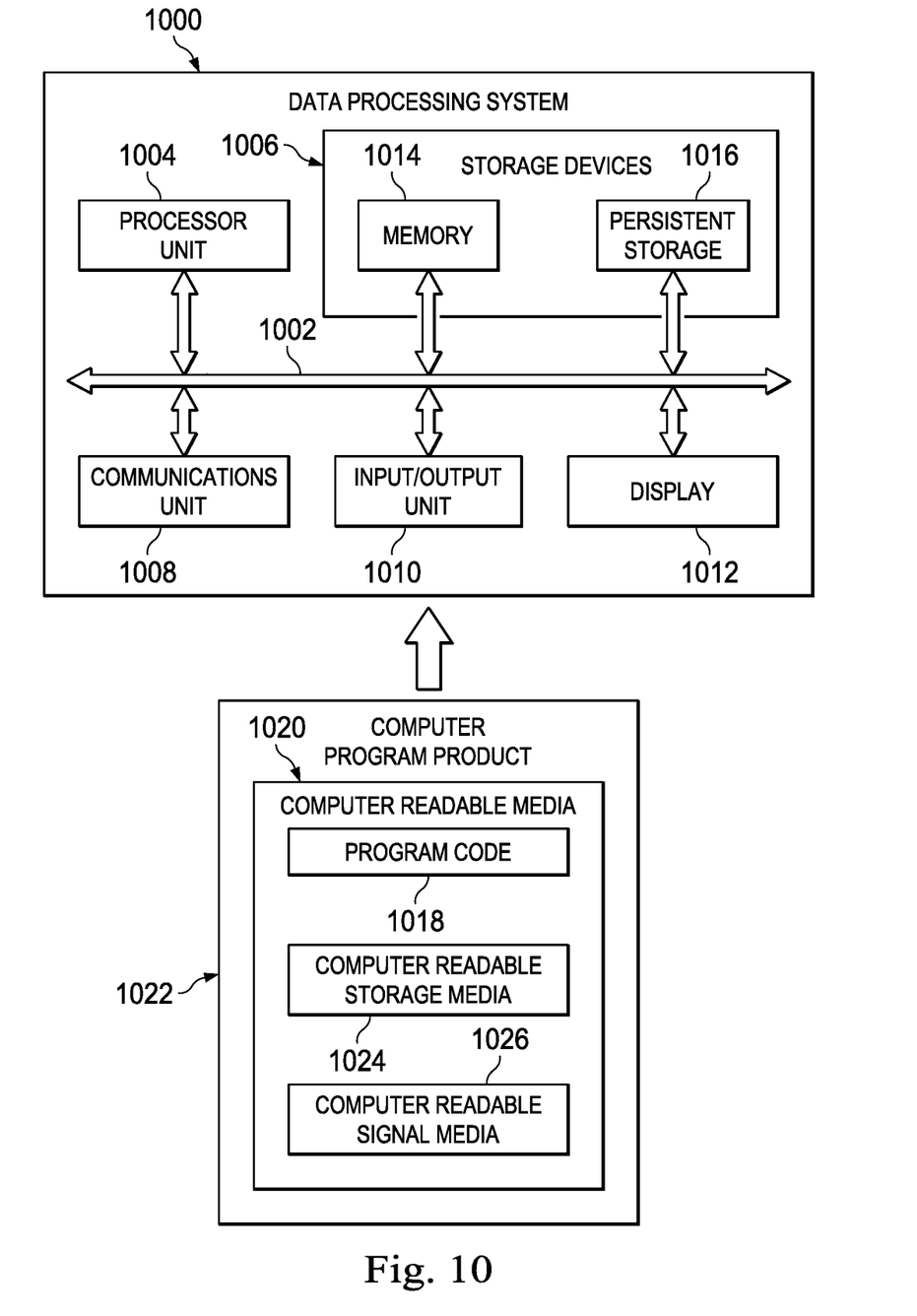
FIG. 10 is a block diagram of a data processing system in accordance with an illustrative embodiment.

Turning now to FIG. 10, a block diagram of a data processing system is depicted in accordance with an illustrative embodiment. Data processing system 1000 may be used to implement any one or more of computer system 108, engineering tool 102, analysis tool 104, product management tool 106, architecture translator 110, analysis translator 112, results reader 114, and requirements verifier 116 in FIG. 1. As depicted, data processing system 1000 includes communications framework 1002, which provides communications between processor unit 1004, storage devices 1006, communications unit 1008, input/output unit 1010, and display 1012. In some cases, communications framework 1002 may be implemented as a bus system.

Processor unit 1004 is configured to execute instructions for software to perform a number of operations. Processor unit 1004 may comprise a number of processors, a multi-processor core, and/or some other type of processor, depending on the implementation. In some cases, processor unit 1004 may take the form of a hardware unit, such as a circuit system, an application specific integrated circuit (ASIC), a programmable logic device, or some other suitable type of hardware unit.

Instructions for the operating system, applications, and/or programs run by processor unit 1004 may be located in storage devices 1006. Storage devices 1006 may be in communication with processor unit 1004 through communications framework 1002. As used herein, a storage device, also referred to as a computer readable storage device, is any piece of hardware capable of storing information on a temporary and/or permanent basis. This information may include, but is not limited to, data, program code, and/or other information.

Memory 1014 and persistent storage 1016 are examples of storage devices 1006. Memory 1014 may take the form of, for example, a random access memory or some type of volatile or non-volatile storage device. Persistent storage 1016 may comprise any number of components or devices. For example, persistent storage 1016 may comprise a hard drive, a flash memory, a rewritable optical disk, a rewritable magnetic tape, or some combination of the above. The media used by persistent storage 1016 may or may not be removable.

Communications unit 1008 allows data processing system 1000 to communicate with other data processing systems and/or devices. Communications unit 1008 may provide communications using physical and/or wireless communications links.

Input/output unit 1010 allows input to be received from and output to be sent to other devices connected to data processing system 1000. For example, input/output unit 1010 may allow user input to be received through a keyboard, a mouse, and/or some other type of input device. As another example, input/output unit 1010 may allow output to be sent to a printer connected to data processing system 1000.

Display 1012 is configured to display information to a user. Display 1012 may comprise, for example, without limitation, a monitor, a touch screen, a laser display, a holographic display, a virtual display device, and/or some other type of display device.

In this illustrative example, the processes of the different illustrative embodiments may be performed by processor unit 1004 using computer-implemented instructions. These instructions may be referred to as program code, computer usable program code, or computer readable program code and may be read and executed by one or more processors in processor unit 1004.

In these examples, program code 1018 is located in a functional form on computer readable media 1020, which is selectively removable, and may be loaded onto or transferred to data processing system 1000 for execution by processor unit 1004. Program code 1018 and computer readable media 1020 together form computer program product 1022. In this illustrative example, computer readable media 1020 may be computer readable storage media 1024 or computer readable signal media 1026.

Computer readable storage media 1024 is a physical or tangible storage device used to store program code 1018 rather than a medium that propagates or transmits program code 1018. Computer readable storage media 1024 may be, for example, without limitation, an optical or magnetic disk or a persistent storage device that is connected to data processing system 1000.

Alternatively, program code 1018 may be transferred to data processing system 1000 using computer readable signal media 1026. Computer readable signal media 1026 may be, for example, a propagated data signal containing program code 1018. This data signal may be an electromagnetic signal, an optical signal, and/or some other type of signal that can be transmitted over physical and/or wireless communications links.

The illustration of data processing system 1000 in FIG. 10 is not meant to provide architectural limitations to the manner in which the illustrative embodiments may be implemented. The different illustrative embodiments may be implemented in a data processing system that includes components in addition to or in place of those illustrated for data processing system 1000. Further, components shown in FIG. 10 may be varied from the illustrative examples shown.

Figure 11:
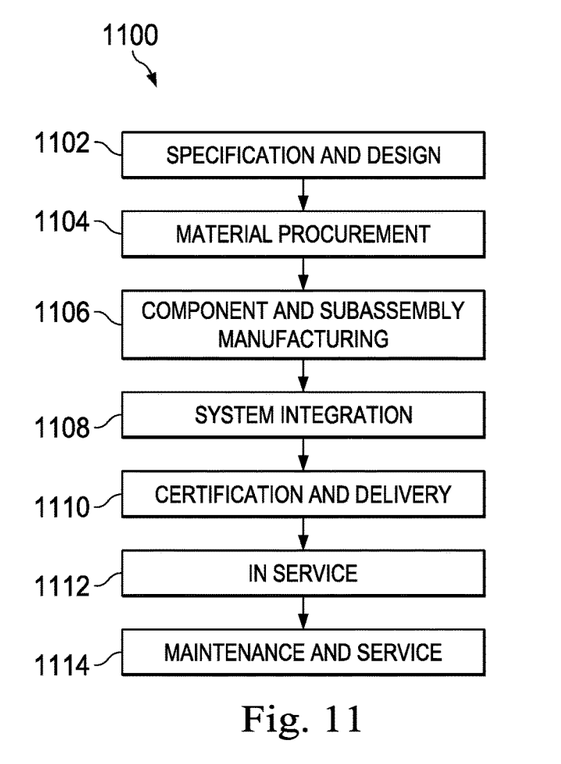
FIG. 11 is a flowchart of an aircraft manufacturing and service method in accordance with an illustrative embodiment.
Figure 12:
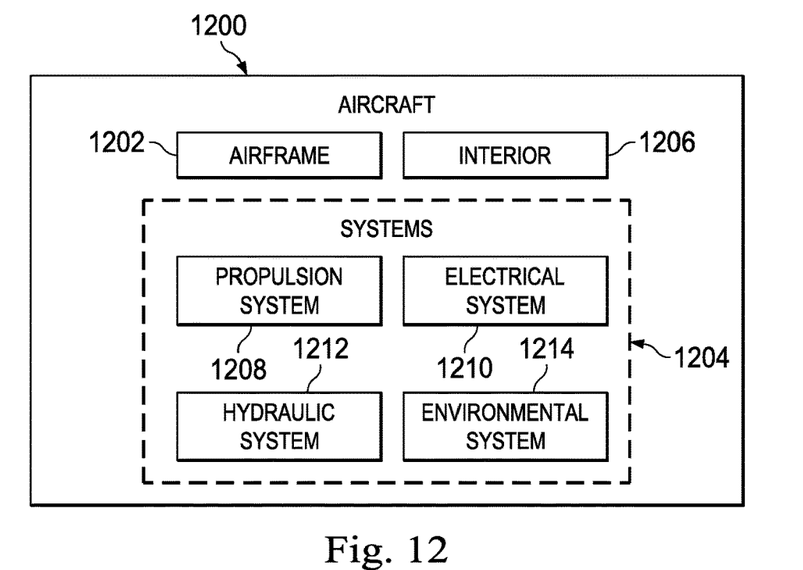
FIG. 12 is a block diagram of an aircraft in accordance with an illustrative embodiment.

Illustrative embodiments of the disclosure may be described in the context of aircraft manufacturing and service method 1100 as shown in FIG. 11 and aircraft 1200 as shown in 12. Turning first to FIG. 11, a flowchart of an aircraft manufacturing and service method is depicted in accordance with an illustrative embodiment. During preproduction, aircraft manufacturing and service method 1100 may include specification and design 1102 of aircraft 1200 in 12 and material procurement 1104.

During production, component and subassembly manufacturing 1106 and system integration A 10 of aircraft 1200 in 12 takes place. Thereafter, aircraft 1200 in 12 may go through certification and delivery 1110 in order to be placed in service 1112. While in service 1112 by a customer, aircraft 1200 in 12 is scheduled for routine maintenance and service 1114, which may include modification, re, refurbishment, and other maintenance or service.

Each of the processes of aircraft manufacturing and service method 1100 may be performed or carried out by a system integrator, a third party, and/or an operator. In these examples, the operator may be a customer. For the purposes of this description, a system integrator may include, without limitation, any number of aircraft manufacturers and major-system subcontractors; a third party may include, without limitation, any number of vendors, subcontractors, and suppliers; and an operator may be an airline, a leasing company, a military entity, a service organization, and so on.

With reference now to 12, a block diagram of an aircraft is depicted in which an illustrative embodiment may be implemented. In this example, aircraft 1200 is produced by aircraft manufacturing and service method 1100 in FIG. 11 and may include airframe 1202 with plurality of systems 1204 and interior 1206. Examples of systems 1204 include one or more of propulsion product 1208, electrical system A, hydraulic system 1212, and environmental system 1214. Any number of other systems may be included. Although an aerospace example is shown, different illustrative embodiments may be applied to other industries, such as the automotive industry.

Apparatuses and methods embodied herein may be employed during at least one of the stages of aircraft manufacturing and service method 1100 in FIG. 11. In particular, the various tools in model-based systems engineering environment 100 described in FIGS. 1-2 may be used in the design and manufacturing of aircraft 1200 and aircraft parts during any one of the stages of aircraft manufacturing and service method 1100. For example, without limitation, these tools may be used during at least one of specification and design 1102, material procurement 1104, component and subassembly manufacturing 1106, system integration 1108, routine maintenance and service 1112, or some other stage of aircraft manufacturing and service method 1100. Still further, these tools may be used to aid in the design, manufacturing, repair, or maintenance of any part of sub-part of aircraft 1200.

In one illustrative example, components or subassemblies produced in component and subassembly manufacturing 1106 in FIG. 11 may be fabricated or manufactured in a manner similar to components or subassemblies produced while aircraft 1200 is in service 1112 in FIG. 11. As yet another example, one or more apparatus embodiments, method embodiments, or a combination thereof may be utilized during production stages, such as component and subassembly manufacturing 1106 and system integration 1108 in FIG. 11. One or more apparatus embodiments, method embodiments, or a combination thereof may be utilized while aircraft 1200 is in service 1112 and/or during maintenance and service 1114 in FIG. 11. The use of a number of the different illustrative embodiments may substantially expedite the assembly of and/or reduce the cost of aircraft 1200.

The description of the different illustrative embodiments has been presented for purposes of illustration and description, and is not intended to be exhaustive or limited to the embodiments in the form disclosed. Many modifications and variations will be apparent to those of ordinary skill in the art. Further, different illustrative embodiments may provide different features as compared to other desirable embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

What is claimed is:

1. A computer-implemented method for automating synchronization of design, analysis, and product management in a model-based systems engineering environment, the computer-implemented method comprising:
linking an analysis template to a system architecture that represents a product to be manufactured;
repeating, for each of a plurality of analyses to be run for the system architecture, a plurality of steps for tracing an evolution of the system architecture from a baseline configuration to a current configuration, the plurality of steps comprising:
creating an analysis instance from the analysis template;
extracting a set of properties for an architectural element of the system architecture based on the analysis instance;
converting the set of properties into a variable input-output structure;
running an analysis of the architectural element using the variable input-output structure to generate results; and
linking the results (1) to the analysis instance such that the analysis instance provides a time-based record of the analysis; (2) to the system architecture to update a set of architectural elements impacted by the results; and (3) to a product management tool, thereby synchronizing the design, the analysis, and the product management of the product to improve an efficiency in the design and manufacturing of the product,
wherein after the linking step, the system architecture has a new configuration; and
generating a configuration report that traces the evolution of the system architecture from the baseline configuration to the current configuration based on linkages between the system architecture and analysis instances.

2. The computer-implemented method of claim 1, further comprising:
translating the configuration report into a set of instructions to be used in the design and the manufacturing of the product.

3. The computer-implemented method of claim 2, further comprising:
sending the set of instructions to a computerized numerically controlled system to control the manufacturing of the product.

4. The computer-implemented method of claim 1, wherein linking the analysis template to the system architecture comprises:
linking a set of source architectural elements and a set of destination architectural elements defined in the analysis template to the system architecture.

5. The computer-implemented method of claim 1, wherein linking the analysis template to the system architecture comprises:
storing the analysis template in association with the system architecture.

6. The computer-implemented method of claim 1, wherein the step of converting the set of properties comprises:
converting the set of properties into a variable input-output structure that has a hierarchical structure corresponding to the system architecture.

7. The computer-implemented method of claim 6, wherein converting the set of properties comprises:
converting the set of properties into a variable input-output structure that includes a set of inputs, a set of outputs, and a set of relationships between the set of inputs and the set of outputs organized based on both the hierarchical structure of the system architecture and the analysis instance.

8. The computer-implemented method of claim 1, wherein linking the results comprises:
storing the results in the analysis instance; and
storing the analysis instance in association with the system architecture.

9. The method of claim 1 further comprising:
performing a verification of the results of the analysis based on a set of requirements for the architectural element.

10. The method of claim 1 further comprising:
generating a request for approval of the results of the analysis; and
initiating the updating of the analysis instance and the architectural element in response to receiving the operator approval.

11. The method of claim 1, wherein both the variable input-output structure and the system architecture have a hierarchical structure.

12. The method of claim 1, wherein linking the results comprises:
uploading the results of the analysis to the product management tool.

13. The method of claim 1, wherein linking the results comprises:
converting the results of the analysis into configured results having a format that is compatible with the product management tool; and
uploading the configured results to the product management tool.

14. The method of claim 13, wherein linking the results comprises:
adding output values resulting from the analysis to the analysis instance based on the configured results; and
generating a linkage between the analysis instance and the configured results.

15. The method of claim 13, wherein linking the results comprises:
modifying at least one property for the set of architectural elements in the system architecture based on the configured results; and
generating at least one linkage between the system architecture and the configured results.

16. The method of claim 1 further comprising:
translating the configuration report into a parametric computer-aided design drawing.

17. The method of claim 1 further comprising:
receiving additional input to be used during the analysis, the additional input including at least one of optimization goals or experimental design constraints.

18. A computer-implemented method for automating synchronization of design, analysis, and product management in a model-based systems engineering environment, the computer-implemented method comprising:

linking an analysis template to a system architecture that represents a product to be manufactured;

repeating, for each of a plurality of analyses to be run for the system architecture, a plurality of steps for tracing an evolution of the system architecture from a baseline configuration to a current configuration, the plurality of steps comprising:

creating an analysis instance from the analysis template;

extracting a set of properties for a set of source architectural elements in a system architecture based on the analysis instance;

converting the set of properties into a variable input-output structure;

running an analysis using the variable input-output structure to generate results;

converting the results of the analysis into configured results that are in a format compatible with a product management tool; and         linking the configured results (1) to the analysis instance such that the analysis instance provides a time-based record of the analysis; (2) to the system architecture to update a set of architectural elements impacted by the results; and (3) to the product management tool, thereby synchronizing the design, the analysis, and the product management of the product to improve an efficiency in the design and manufacturing of the product,         wherein after the linking step, the system architecture has a new configuration.

19. The method of claim 18, wherein linking the results comprises:

adding input values and output values to the analysis instance based on the configured results;

generating a linkage between the analysis instance and the configured results;

modifying at least one property for a set of destination architectural elements in the system architecture based on the configured results; and     uploading the configured results to the product management tool.

20. A system comprising:

at least one memory storing computer readable program code; and     at least one processor coupled to the memory and configured to execute the computer readable program code to:

link an analysis template to a system architecture representing a product to be manufactured via an engineering tool;

repeat, for each of a plurality of analyses to be run for the system architecture, a plurality of steps for tracing an evolution of the system architecture from a baseline configuration to a current configuration, the plurality of steps comprising:

creating an analysis instance from the analysis template;

extracting a set of properties for an architectural element of the system architecture based on the analysis instance via the engineering tool;

converting the set of properties into a variable input-output structure via an architecture translator;

running an analysis using the variable input-output structure to generate results via an analysis tool;

converting the results of the analysis into configured results that are in a format compatible with a product management tool via an analysis translator; and         linking the configured results (1) to the analysis instance such that the analysis instance provides a time-based record of the analysis; (2) to the system architecture to update a set of architectural elements impacted by the results; and (3) to the product management tool, thereby synchronizing the design, the analysis, and the product management of the product to improve an efficiency in the design and manufacturing of the product,     wherein after the linking step, the system architecture has a new configuration.

21. The system of claim 20, wherein the processor is further configured to execute the computer readable program code to add output values from the configured results to the analysis instance and generate a linkage between the configured results and the analysis instance.

22. The system of claim 20, wherein the configured results are modifying at least one property for the set of architectural elements in the system architecture.

23. The system of claim 20, wherein the processor is further configured to execute the computer readable program code to translate the configuration report into a parametric computer-aided design drawing.

24. The system of claim 20, wherein the architecture translator is configured to generate a configuration report that traces the evolution of the system architecture from the baseline configuration to the current configuration based on linkages between the system architecture and analysis instances.

25. The system of claim 20, wherein the architecture translator converts the set of properties into a variable input-output structure that includes a set of inputs, a set of outputs, and a set of relationships between the set of inputs and the set of outputs organized based on both the analysis instance and a hierarchical structure of the system architecture.

\* \* \* \* \*